US012708032B2

(12) United States Patent
Kisaki

(10) Patent No.: US 12,708,032 B2
(45) **Date of Patent: *Aug. 11, 2026**

(54) PACKAGE FOR ACCOMMODATING ELECTRONIC COMPONENT, ELECTRONIC APPARATUS, AND ELECTRONIC MODULE

(71) Applicant: KYOCERA Corporation, Kyoto (JP)

(72) Inventor: Takuo Kisaki, Satsumasendai (JP)

(73) Assignee: KYOCERA CORPORATION, Kyoto (JP)

( * ) Notice: Subject to any disclaimer, the term of this patent is extended or adjusted under 35 U.S.C. 154(b) by 456 days.

This patent is subject to a terminal disclaimer.

(21) Appl. No.: 18/273,408

(22) PCT Filed: Jan. 20, 2022

(86) PCT No.: PCT/JP2022/002059

§ 371 (c)(1),
(2) Date: Jul. 20, 2023

(87) PCT Pub. No.: WO2022/163502

PCT Pub. Date: Aug. 4, 2022

(65) Prior Publication Data

US 2024/0145318 A1 May 2, 2024

(30) Foreign Application Priority Data

Jan. 27, 2021 (JP) ................................ 2021-011536

(51) Int. Cl.
*H10W 76/15* (2026.01)
*H03B 5/32* (2006.01)
(Continued)

(52) U.S. Cl.
CPC ........... *H10W 76/15* (2026.01); *H10W 70/60* (2026.01); *H10W 70/65* (2026.01); *H10W 70/657* (2026.01); *H03B 5/32* (2013.01)

(58) Field of Classification Search
CPC ... H03H 9/1014–1028; H03H 9/02086; H03H 9/02133; H03H 9/1007–105;
(Continued)

(56) References Cited

U.S. PATENT DOCUMENTS 5,686,172 A * 11/1997 Ohya ...................... H01L 23/15 174/250
12,177,983 B2 * 12/2024 Onitsuka ................ H05K 1/185
(Continued)

FOREIGN PATENT DOCUMENTS

CN 110612780 A 12/2019
CN 114762098 A 7/2022
(Continued)

*Primary Examiner* — Zandra V Smith
*Assistant Examiner* — Douglas Yap
(74) *Attorney, Agent, or Firm* — Volpe Koenig

(57) ABSTRACT

A package for accommodating an electronic component includes an insulating substrate, an external-connection conductor, and a corner conductor. The insulating substrate includes a first surface including a mount portion to receive an electronic component, a second surface opposite to the first surface, a first side surface connecting the first surface and the second surface, a second side surface connecting the first surface and the second surface and continuous with the first side surface, and a corner at which the first side surface and the second side surface intersect. The external-connection conductor is located on the second surface. The corner conductor extends from the external-connection conductor toward the corner at a gradually greater distance to the external-connection conductor and includes exposed portions exposed on the first side surface excluding the corner and on the second side surface excluding the corner.

11 Claims, 13 Drawing Sheets

(51) Int. Cl.
*H10W 70/60* (2026.01)
*H10W 70/65* (2026.01)

(58) Field of Classification Search
CPC ..................... H01L 23/02; H01L 23/04; H01L 23/053–057; H01L 23/13; H01L 23/15; H01L 23/291; H01L 23/3121; H01L 23/3128; H01L 23/481; H01L 23/49822; H01L 23/49838–49844; H01L 23/49805; H01L 23/5283; H03B 5/32; H03B 5/323; H03B 5/326; H03B 5/36–368; H10W 76/15–157; H10W 70/60; H10W 70/611–614; H10W 70/62; H10W 70/635; H10W 70/6525; H10W 70/6528; H10W 70/657; H10W 70/67; H10W 70/68; H10W 70/685–687
See application file for complete search history.

(56) References Cited

U.S. PATENT DOCUMENTS

| | | | | |
|---|---|---|---|---|
| 2013/0098654 | A1* | 4/2013 | Lizuka ................ | H05K 5/0091 174/50 |
| 2018/0358949 | A1 | 12/2018 | Kisaki et al. | |
| 2019/0043770 | A1* | 2/2019 | Kisaki .................... | H01L 23/04 |
| 2020/0168577 | A1 | 5/2020 | Onitsuka | |
| 2022/0385266 | A1 | 12/2022 | Sasaki | |

FOREIGN PATENT DOCUMENTS

| | | | |
|---|---|---|---|
| JP | 2004247599 | A | 9/2004 |
| JP | 2005-050935 | A | 2/2005 |
| JP | 2017063165 | A | 3/2017 |
| KR | 20170121285 | A | 11/2017 |
| KR | 20170122255 | A | 11/2017 |
| WO | 2020262472 | A1 | 12/2020 |

* cited by examiner

II
100
117
II
113
114
105A 105B
105C 104 102A 105
101

200
100A
100A
100A
101
107
106
102
114
102A
104
113
117
123
108
117
103
108
109
110

PACKAGE FOR ACCOMMODATING ELECTRONIC COMPONENT, ELECTRONIC APPARATUS, AND ELECTRONIC MODULE

TECHNICAL FIELD

The present disclosure relates to a package for accommodating an electronic component such as a piezoelectric oscillator.

BACKGROUND OF INVENTION

A known technique is described in, for example, Patent Literature 1.

CITATION LIST

Patent Literature

Patent Literature 1: Japanese Unexamined Patent Application Publication No. 2005-50935

SUMMARY

In an aspect of the present disclosure, a package for accommodating an electronic component includes an insulating substrate, an external-connection conductor, and a corner conductor. The insulating substrate includes a first surface including a mount portion to receive an electronic component, a second surface opposite to the first surface, a first side surface connecting the first surface and the second surface, a second side surface connecting the first surface and the second surface and continuous with the first side surface, and a corner at which the first side surface and the second side surface intersect. The external-connection conductor is located on the second surface. The corner conductor extends from the external-connection conductor toward the corner. The corner conductor extends from the external-connection conductor toward the corner at a gradually greater distance to the external-connection conductor and includes exposed portions exposed on the first side surface excluding the corner and on the second side surface excluding the corner.

In an aspect of the present disclosure, an electronic apparatus includes the above package, and an electronic component mounted on the package.

In an aspect of the present disclosure, an electronic module includes the above electronic apparatus, and a module substrate connected to the electronic apparatus.

DESCRIPTION OF EMBODIMENTS

Figures 1, 2:
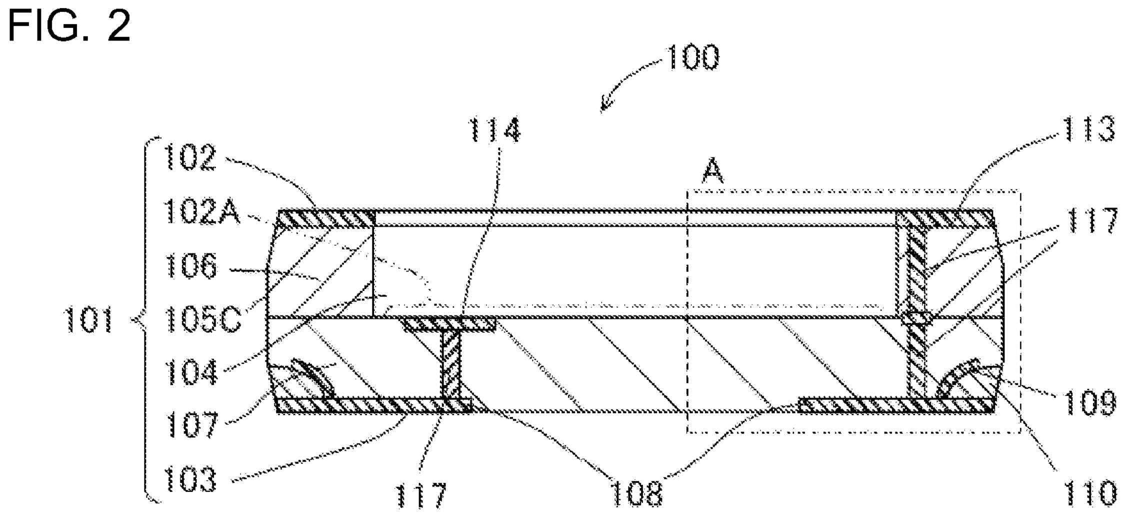
FIG. 1 is a top view of a package for accommodating an electronic component according to an embodiment.
FIG. 2 is a cross-sectional view taken along line II-II in FIG. 1.

The objects, features, and advantages of the present disclosure will become more apparent from the following detailed description and the drawings.

An insulating substrate including a recessed mount to accommodate an electronic component is used as a package for accommodating an electronic component for mounting an electronic component such as a piezoelectric oscillator or a semiconductor device, with the structure that forms the basis of a package for accommodating an electronic component according to one or more embodiments of the present disclosure. The insulating substrate includes an upper surface to which a lid is connected to seal the mount. In such a package for accommodating an electronic component, the insulating substrate includes a flat base including the mount for an electronic component on its upper surface and a frame stacked on the upper surface to surround the mount, and a wiring conductor extending from the mount to the lower surface of the base.

A package for accommodating an electronic component according to one or more embodiments of the present disclosure (hereafter also referred to as a wiring board) will now be described with reference to the drawings. The drawings used herein are schematic and are not drawn to scale relative to the actual size of each component in the drawings.

Figure 3:
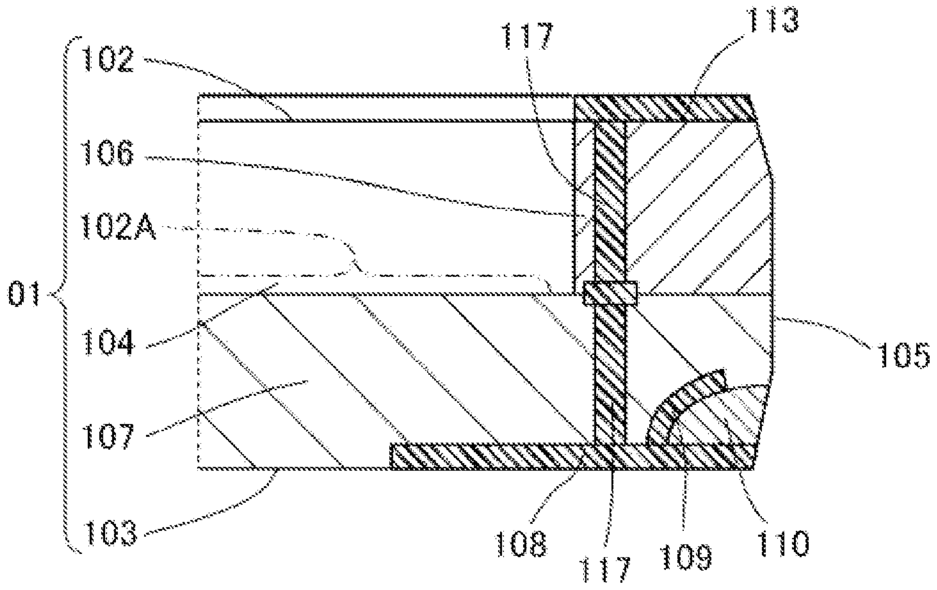
FIG. 3 is an enlarged cross-sectional view of part A in FIG. 2.
Figure 4A:
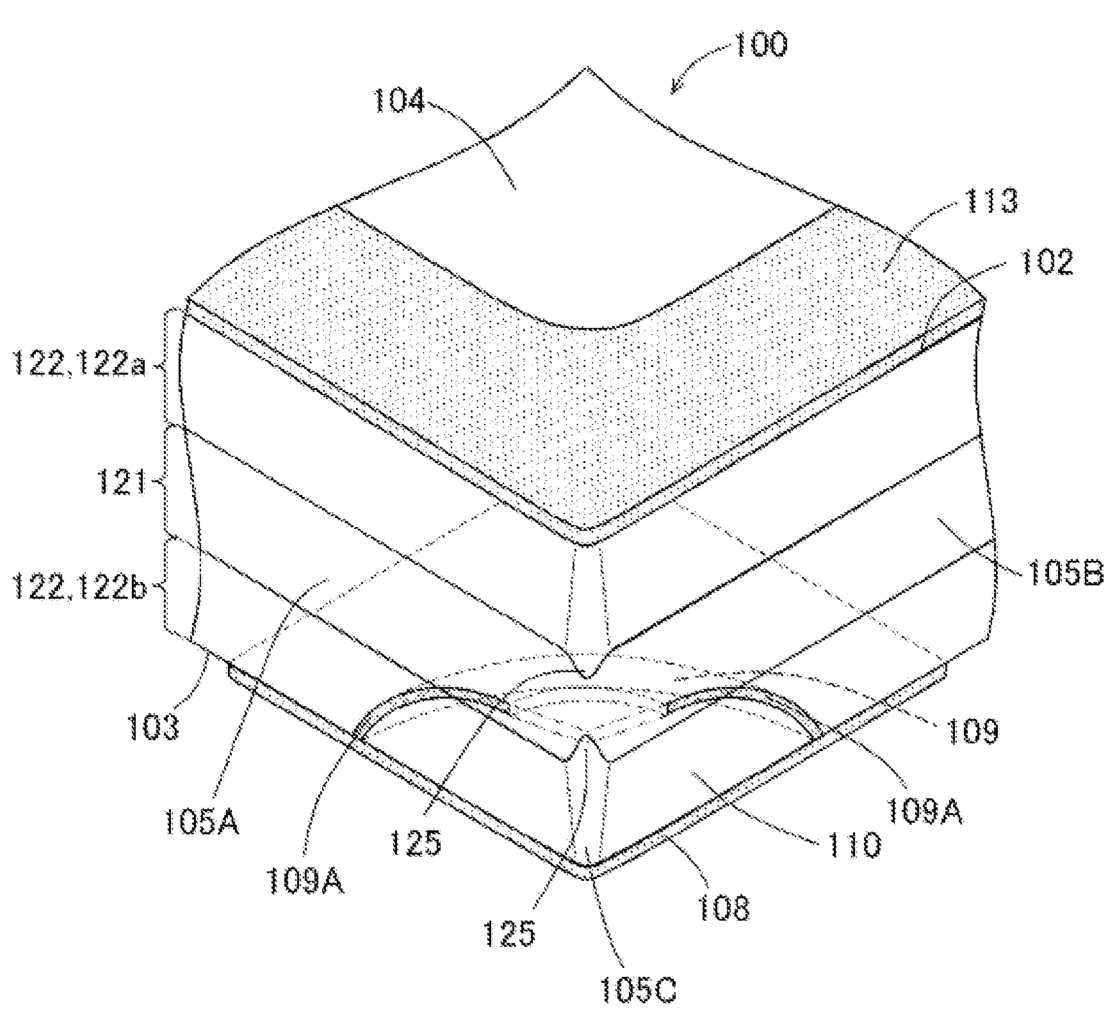
FIG. 4A is a perspective view of the package for accommodating an electronic component according to the present embodiment, illustrating its main components.
Figure 4B:
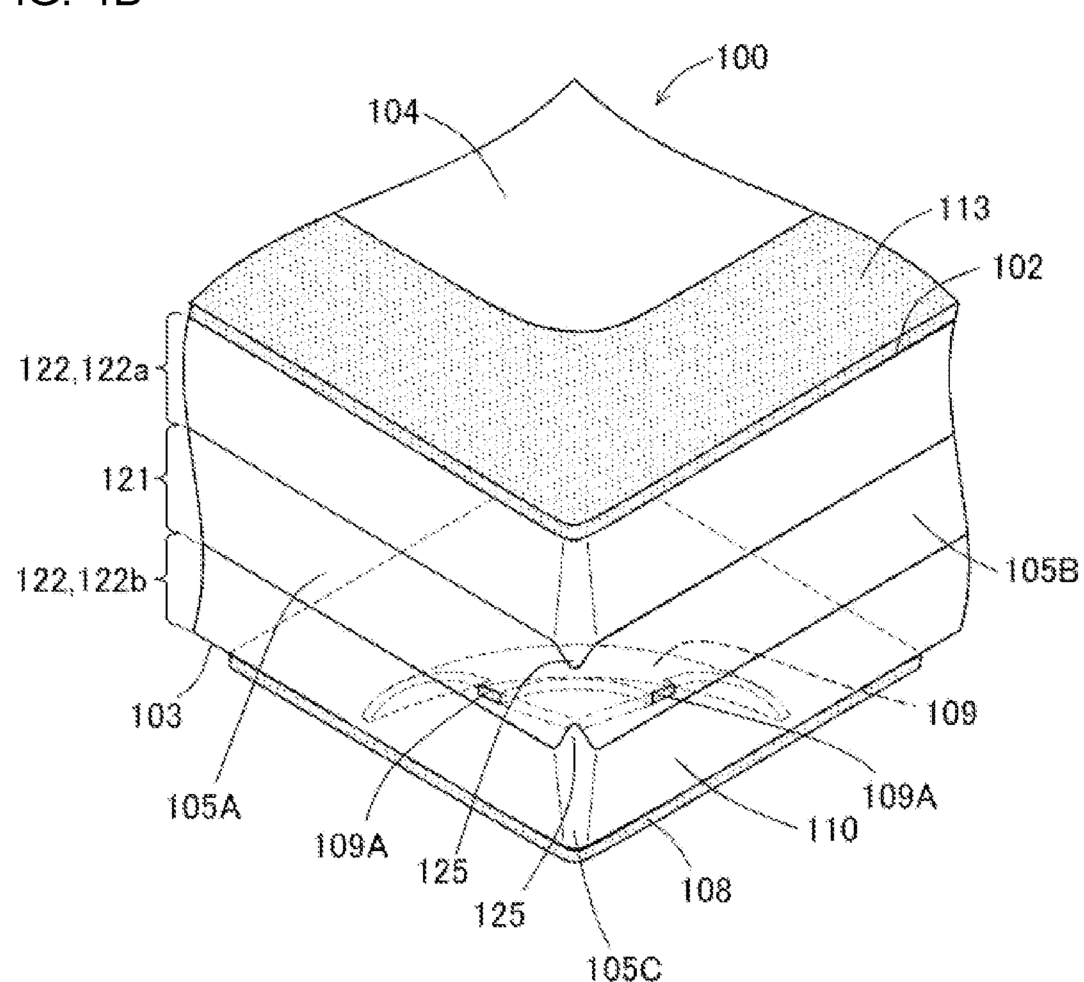
FIG. 4B is a perspective view of another example of the package for accommodating an electronic component according to the present embodiment, illustrating its main components.
Figure 5:
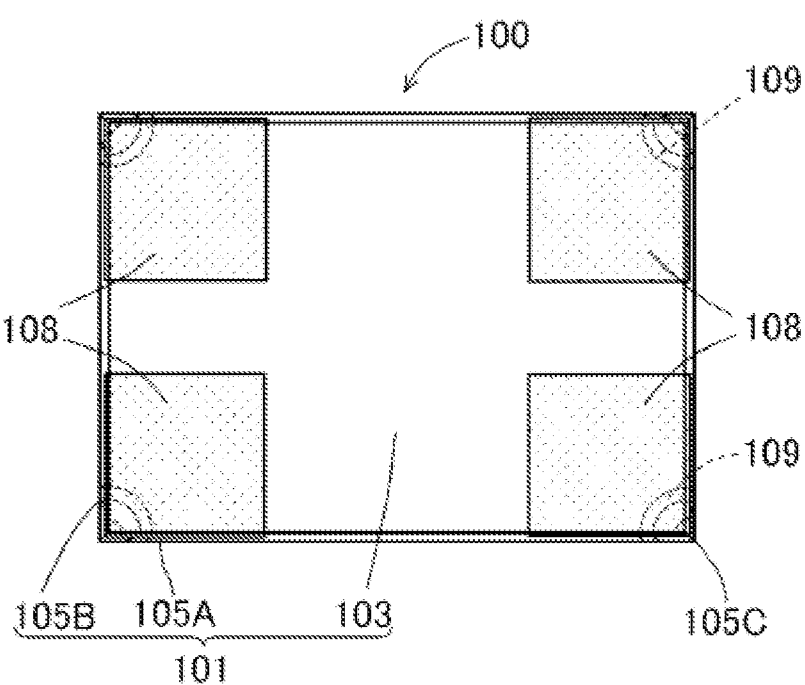
FIG. 5 is a bottom view of the package for accommodating an electronic component according to the present embodiment.
Figure 6A:
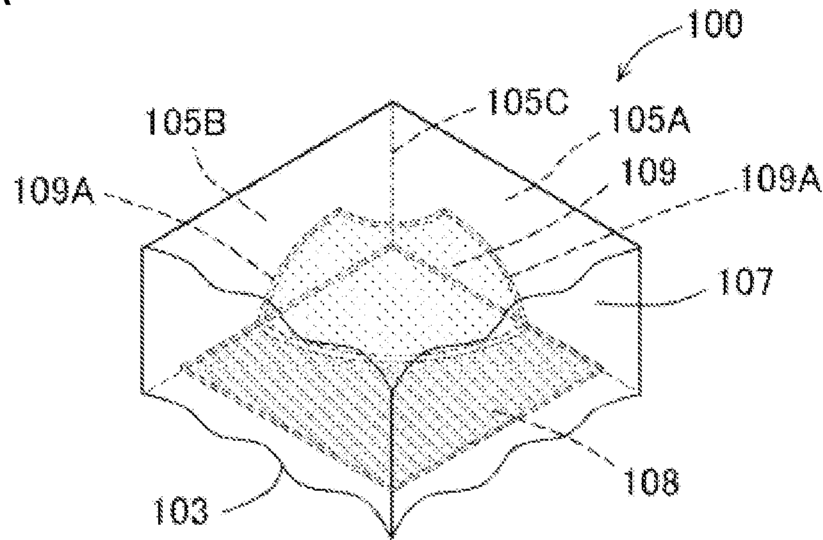
FIG. 6A is a perspective view of the package for accommodating an electronic component according to the present embodiment, illustrating its main components.
Figure 9A:
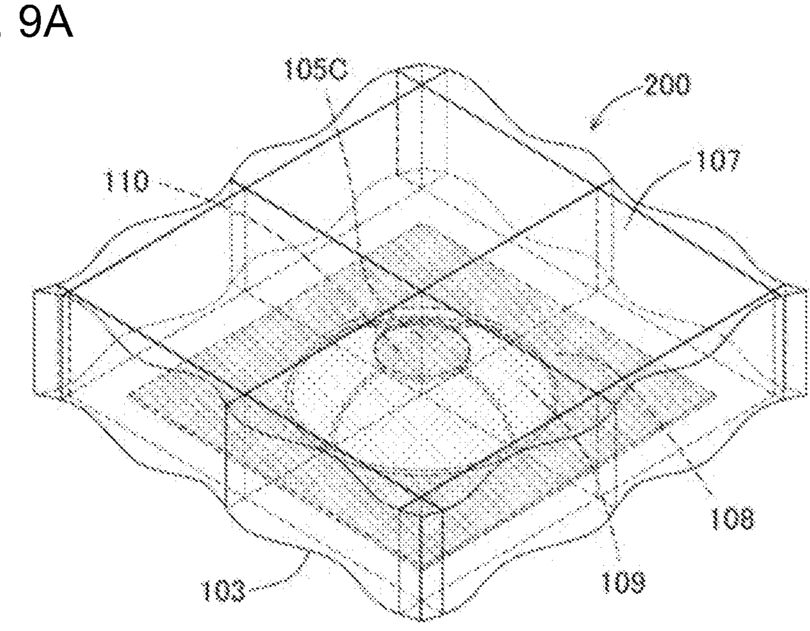
FIG. 9A is a perspective view of the multi-piece wiring substrate for fabricating packages for accommodating electronic components according to the present embodiment, illustrating its main components.
Figure 9B:
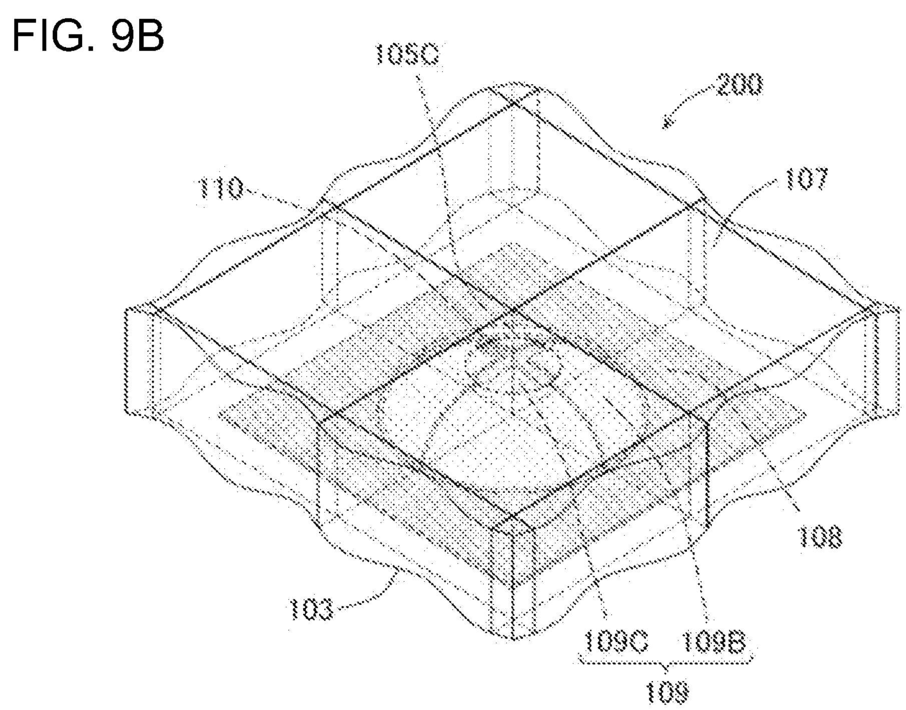
FIG. 9B is a perspective view of a multi-piece wiring substrate for fabricating packages for accommodating electronic components according to another example of the present embodiment, illustrating its main components.
Figure 9C:
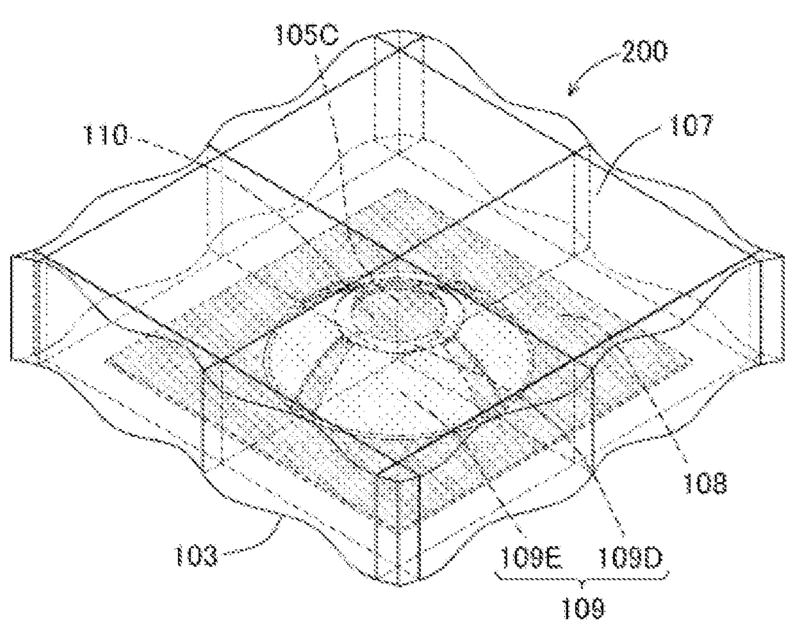
FIG. 9C is a perspective view of a multi-piece wiring substrate for fabricating packages for accommodating electronic components according to another example of the present embodiment, illustrating its main components.
Figure 9D:
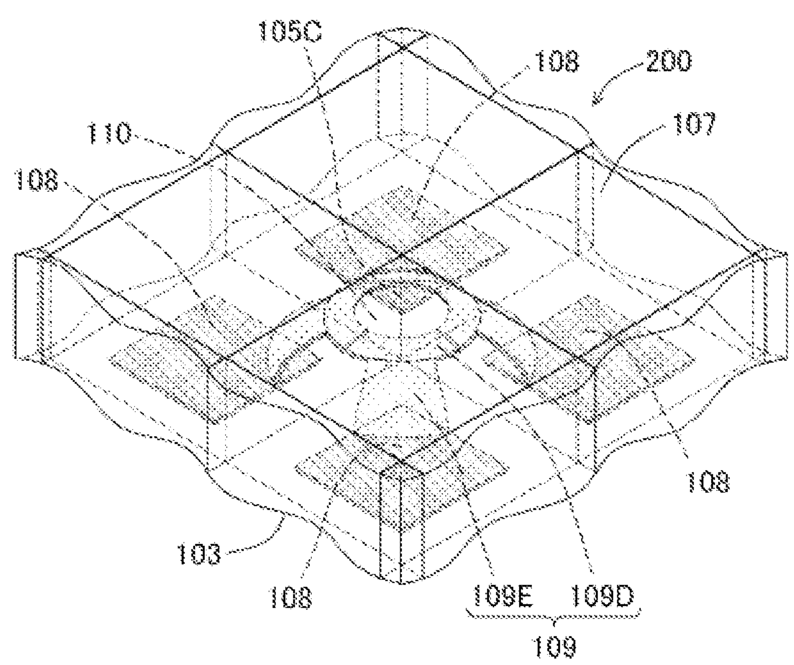
FIG. 9D is a perspective view of a multi-piece wiring substrate for fabricating packages for accommodating electronic components according to another example of the present embodiment, illustrating its main components.
Figure 9E:
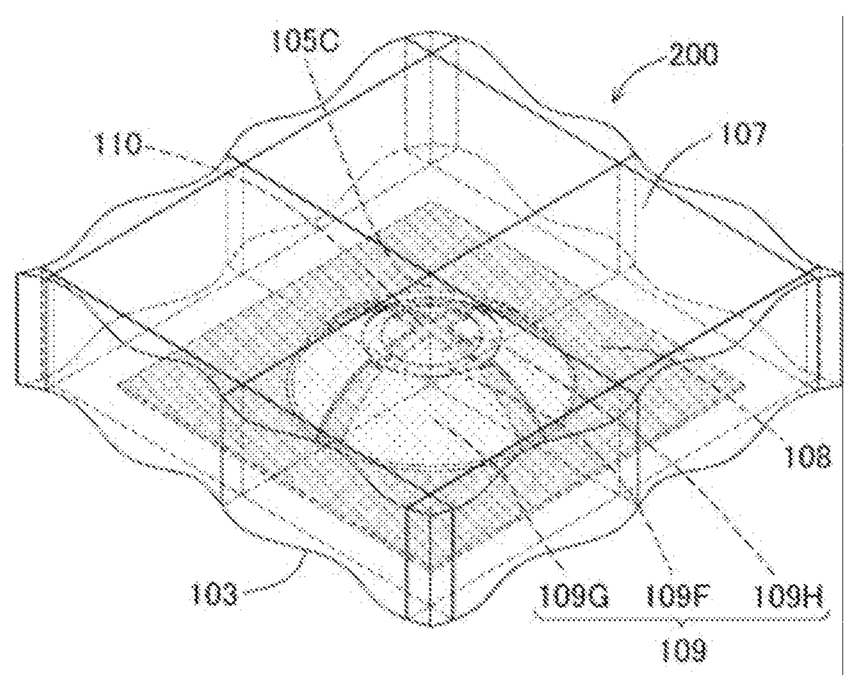
FIG. 9E is a perspective view of a multi-piece wiring substrate for fabricating packages for accommodating electronic components according to another example of the present embodiment, illustrating its main components.
Figure 10:
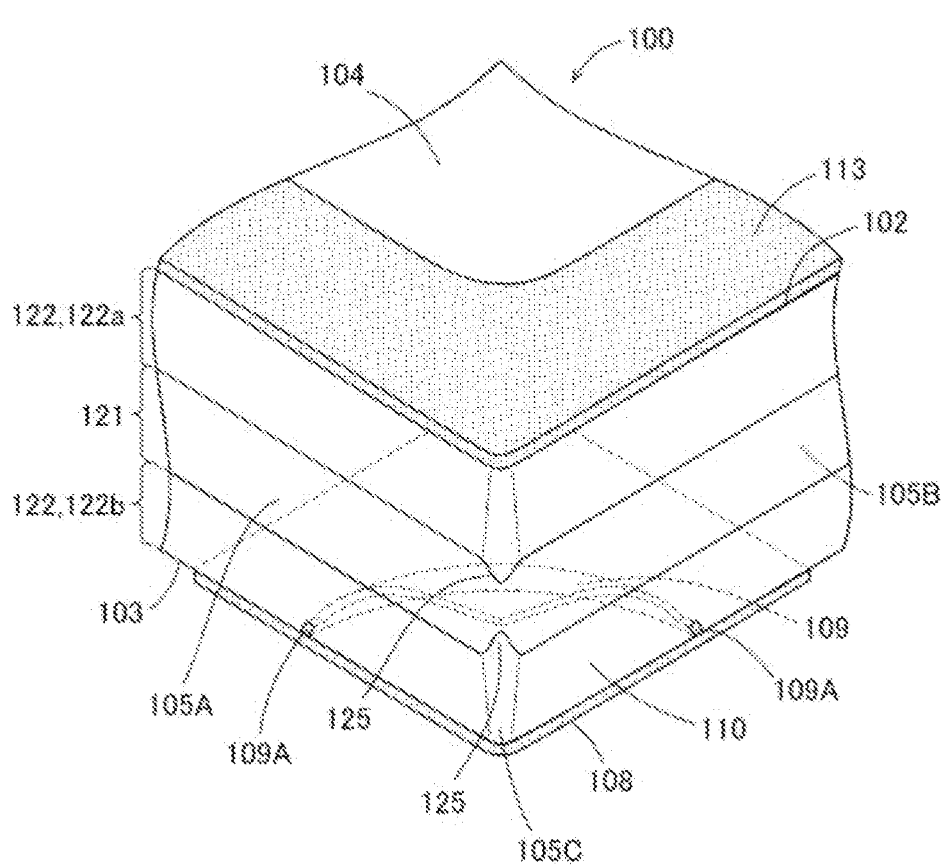
FIG. 10 is a perspective view of the package for accommodating an electronic component according to the present embodiment, illustrating its main components.
Figure 11:
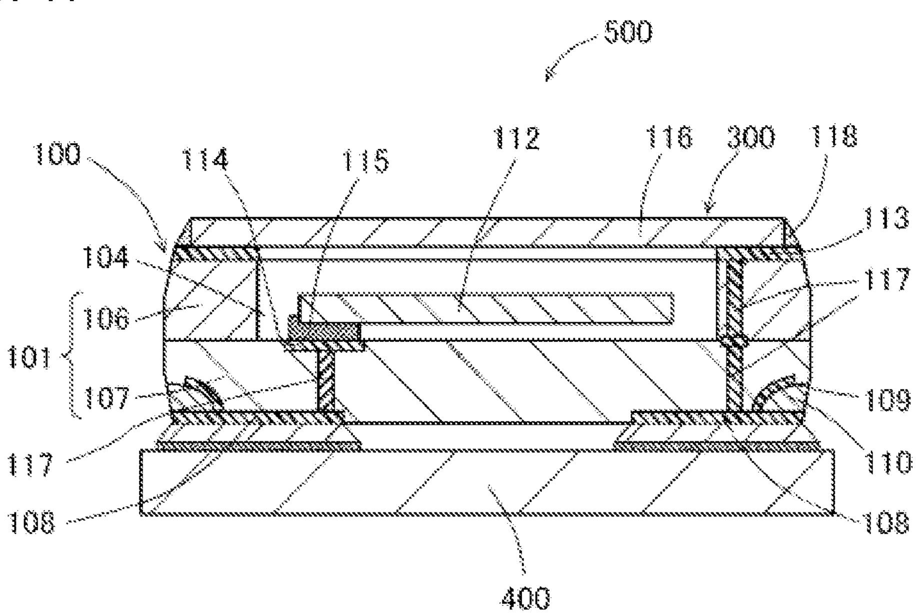
FIG. 11 is a cross-sectional view of an electronic component and an electronic module according to the present embodiment.
Figure 12:
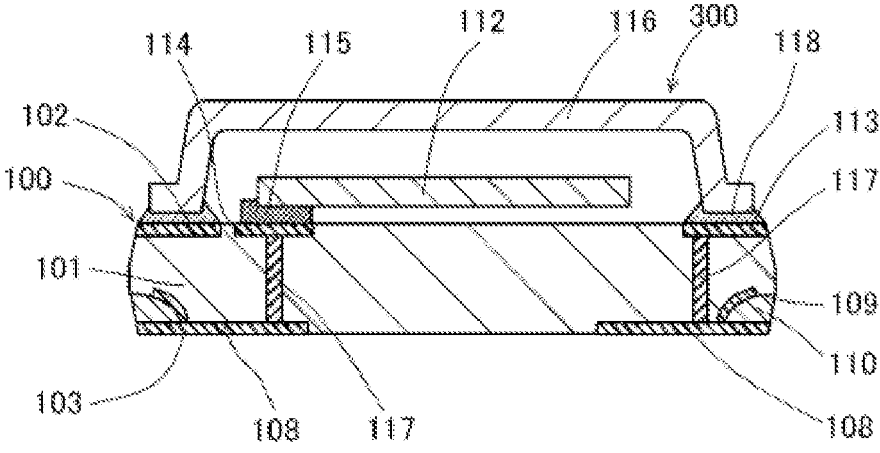
FIG. 12 is a cross-sectional view of another example of the package for accommodating an electronic component and an electronic apparatus according to the present embodiment.

FIG. 1 is a top view of the package for accommodating an electronic component according to the present embodiment. FIG. 2 is a cross-sectional view taken along line II-II in FIG. 1. FIG. 3 is an enlarged cross-sectional view of part A in FIG. 2. FIG. 4A is a perspective view of the package for accommodating an electronic component according to the present embodiment, illustrating its main components. FIG. 4B is a perspective view of another example of the package for accommodating an electronic component according to the present embodiment, illustrating its main components. FIG. 5 is a bottom view of the package for accommodating an electronic component according to the present embodiment. FIG. 6A is a perspective view of the package for accommodating an electronic component according to the present embodiment, illustrating its main components. FIGS. 6B to 6E are perspective views of other examples of the package for accommodating an electronic component according to the present embodiment, illustrating their main components. FIG. 7 is a plan view of an example multi-piece wiring substrate for fabricating packages for accommodating electronic components according to the present embodiment, illustrating its main components. FIG. 8 is a cross-sectional view taken alone line VIII-VIII in FIG. 7. FIG. 9A is a perspective view of the multi-piece wiring substrate for fabricating packages for accommodating electronic components according to the present embodiment, illustrating its main components. FIGS. 9B to 9E are perspective views of multi-piece wiring substrates for fabricating packages for accommodating electronic components according to other examples of the present embodiment, illustrating their main components. FIG. 10 is a perspective view of the package for accommodating an electronic component according to the present embodiment, illustrating its main components. FIG. 11 is a cross-sectional view of an electronic component and an electronic module according to the present embodiment. FIG. 12 is a cross-sectional view of another example of the package for accommodating an electronic component and an electronic apparatus according to the present embodiment.

A package 100 for accommodating an electronic component includes an insulating substrate 101, external-connection conductors 108, and corner conductors 109.

The insulating substrate 101 includes a first surface 102, a second surface 103, a first side surface 105A, and a second side surface 105B.

The insulating substrate 101 may further include, on a part of the first surface 102, a frame-shaped metallized layer 113 to be sealed by, for example, a lid. The frame-shaped metallized layer 113 includes an upper surface as a seal surface to be sealed by, for example, a lid. The second surface 103 is opposite to the first surface 102 and allows mounting on a module substrate. The first side surface 105A connects the first surface 102 and the second surface 103. The second side surface 105B connects the first surface 102 and the second surface 103 and is continuous with the first side surface 105A. The insulating substrate 101 includes a corner 105C (dihedral angle) at which the first side surface 105A and the second side surface 105B intersect. The first side surface 105A and the second side surface 105B may be collectively referred to as side surfaces 105.

The insulating substrate 101 includes, on the first surface 102, a mount portion 102A to receive an electronic component. An electronic component 112 is mounted on the mount portion 102A. The electronic component 112 may be, for example, a piezoelectric oscillator, a semiconductor device, a capacitor, or a resistance. As illustrated in, for example, FIGS. 1 and 2, the insulating substrate 101 may include a cavity 104 that is open in the first surface 102. The mount portion 102A may be located at the bottom of the cavity 104.

The insulating substrate 101 is made of an insulator. The insulator is made of, for example, a ceramic material such as sintered aluminum oxide, sintered aluminum nitride, sintered mullite, or sintered glass-ceramics. The insulating substrate 101 has, for example, a generally rectangular profile with each side having a length of about 0.6 to 10 mm in a plan view. The insulating substrate 101 is a plate with a thickness of about 0.15 to 2 mm. The cavity 104 is a rectangle with each side having a length of about 0.4 to 9.0 mm and a depth of about 0.1 to 1.5 mm in a plan view.

The external-connection conductors 108 are located on the second surface 103. As illustrated in, for example, FIG. 5, the external-connection conductors 108 are located close to the corners 105C of the insulating substrate 101. The external-connection conductor 108 is, for example, square or rectangular in a transparent plan view with two adjacent sides overlapping two sides of the second surface 103. The external-connection conductor 108 may be spaced inward from the periphery of the second surface 103 in a plan view.

The external-connection conductor 108 is made of, for example, a metal material such as tungsten, molybdenum, manganese, copper, gold, palladium, platinum, nickel, or cobalt. The external-connection conductor 108 may be made of an alloy material containing any of these metal materials as a main component.

Corner conductors 109 extend from the respective external-connection conductors 108 toward the respective corners 105C. Each corner conductor 109 extends from the corresponding external-connection conductor 108 toward the corresponding corner 105C at a gradually greater distance to the external-connection conductor 108 and to the second surface 103. The corner conductor 109 may be curved in a convex toward the first surface 102. As illustrated in, for example, FIG. 4A, the corner conductor 109 is exposed on the first side surface 105A and the second side surface 105B excluding the corner 105C. In other words, the corner conductor 109 is not exposed on the corner 105C, but includes portions exposed on the first side surface 105A and the second side surface 105B (hereafter also referred to as exposed portions 109A). The exposed portions 109A may be connected to or spaced from the external-connection conductor 108 in a side view (more specifically, as viewed in the direction orthogonal to the first side surface 105A or the second side surface 105B).

The corner conductor 109 is made of, for example, a metal material such as tungsten, molybdenum, manganese, copper, gold, palladium, platinum, nickel, or cobalt. The corner conductor 109 may be made of an alloy material containing any of these metal materials as a main component.

The insulating substrate 101 includes the frame-shaped metallized layer 113 on outer edges of the first surface 102. The mount portion 102A is located inward from the frame-shaped metallized layer 113 in a plan view. The mount portion 102A includes a pair of connection pads 114 to which the electronic component 112 is connected. With the electronic component 112 connected to the connection pads 114 and a lid 116 bonded to the frame-shaped metallized layer 113, the electronic component 112 is sealed hermetically. The lid 116 may be bonded to the frame-shaped metallized layer 113 with, for example, a brazing material 118 such as a gold-tin alloy. A metal frame may be bonded to the frame-shaped metallized layer 113 to have its upper surface as the seal surface.

The electronic component 112 may be, for example, a rectangular plate. The mount portion 102A may be, for example, rectangular in a plan view as appropriate for the shape of the electronic component 112. In FIG. 1, the mount portion 102A is indicated by an imaginary two-dot-dash line. The term rectangular herein is not limited to being precisely rectangular and includes, for example, a rectangle with rounded corners. In FIG. 1, each connection pad 114 in the pair is located at a corner at either end of a short side of the rectangular mount portion 102A. The connection pads 114 serve as conductor layers for connecting electrodes (not illustrated) of the electronic component 112 such as a piezoelectric oscillator mounted on the mount portion 102A. The electronic component 112 being a piezoelectric oscillator typically has a rectangular profile in a plan view and includes a pair of electrodes (not illustrated) for connection at corners on its surface. To connect such electrodes to the connection pads 114 easily and reliably, the connection pads 114 are located closer to the corners of the mount portion 102A.

The number of connection pads 114 described above and their arrangement are used when the electronic component 112 is a piezoelectric oscillator. The number of connection pads 114 and their arrangement may be set based on the number and the arrangement of electrodes of the electronic component 112 to be mounted and the number of electronic components 112 to be mounted.

As illustrate in, for example, FIGS. 2 and 3, the insulating substrate 101 may include an upper insulating layer 106 and a lower insulating layer 107 stacked on each other. In the insulating substrate 101, the frame-shaped upper insulating layer 106 including an opening corresponding to the cavity 104 is stacked on the flat lower insulating layer 107. The upper insulating layer 106 surrounds, in a plan view, the mount portion 102A on the upper surface of the lower insulating layer 107. The insulating substrate 101 includes the recessed cavity 104 including the mount portion 102A to receive the electronic component 112. The recessed cavity 104 is defined by inner side surfaces of the upper insulating layer 106 and the lower insulating layer 107 exposed inside the mount portion 102A. The electronic component 112 received in the cavity 104 is surrounded and protected by the upper insulating layer 106 and the lower insulating layer 107. The electronic component 112 is sealed hermetically with the lid 116 covering the opening of the cavity 104. The lid 116 may be a flat plate.

The upper insulating layer 106 may include two or more insulating layers. The cavity 104 may thus include stepped inner side surfaces to accommodate multiple electronic components 112.

The frame-shaped metallized layer 113 is located on the first surface 102 (the upper surface of the upper insulating layer 106) of the insulating substrate 101. Inside the upper insulating layer 106, a feedthrough conductor 117 extends, for example, from its upper surface to its lower surface. Another feedthrough conductor 117 is also located inside the lower insulating layer 107 immediately below the feedthrough conductor 117. In the example illustrated in FIGS. 1 and 2, the feedthrough conductor 117 is located at a corner of the frame-shaped metallized layer 113 in the insulating substrate 101. However, a strip-shaped wiring conductor as a conductive path may be located on, for example, an outer side surface of the insulating substrate 101 or an inner side surface of the cavity 104.

The feedthrough conductor 117 inside the upper insulating layer 106 and the feedthrough conductor 117 inside the lower insulating layer 107 overlap each other in a transparent plan view and are electrically connected to each other. As illustrated in, for example, FIGS. 2 and 3, a relay conductor may be located between the feedthrough conductor 117 inside the upper insulating layer 106 and the feedthrough conductor 117 inside the lower insulating layer 107. This structure allows, when the upper insulating layer 106 and the lower insulating layer 107 are, for example, misaligned from each other in stacking, the feedthrough conductor 117 inside the upper insulating layer 106 and the feedthrough conductor 117 inside the lower insulating layer 107 to remain connected to each other.

In the package 100 for accommodating an electronic component, the frame-shaped metallized layer 113, the feedthrough conductor 117 inside the upper insulating layer 106, the relay conductor, and the feedthrough conductor 117 inside the lower insulating layer 107 are electrically connected with one another. The feedthrough conductor 117 inside the lower insulating layer 107 is connected to one of the external-connection conductors 108 on the second surface 103. In other words, the package 100 for accommodating an electronic component includes the frame-shaped metallized layer 113, the feedthrough conductor 117 inside the upper insulating layer 106, the relay conductor, the feedthrough conductor 117 inside the lower insulating layer 107, and the external-connection conductor 108 electrically connected with one another. In this structure, the lid 116 made of a conductive material such as a metal is bonded to the frame-shaped metallized layer 113 with a conductive bond such as the brazing material 118, and one of the external-connection conductors 108 is connected to a ground potential to allow the lid 116 to serve as a shield against electromagnetic noise.

The lower insulating layer 107 includes the connection pads 114 on the mount portion 102A to serve as conductive paths for electrically connecting the electronic component 112 to be mounted and an external electric circuit in a module substrate. The lower insulating layer 107 also includes the feedthrough conductor 117 and the relay conductor. The lower insulating layer 107 also includes the external-connection conductor 108 on its lower surface (second surface 103).

The corner conductors 109, the frame-shaped metallized layer 113, the connection pads 114, and the external-connection conductors 108 (hereafter also collectively referred to as wiring conductors WC) in the package 100 for accommodating an electronic component may include exposed surfaces sequentially plated with nickel and gold. This prevents oxidative corrosion of the wiring conductors WC and facilitates connection of the wiring conductors WC to the electronic component or the module substrate. The exposed surfaces of the wiring conductors WC may be plated by, for example, electroplating.

Without the corner conductor 109 exposed on the corner 105C, the package 100 for accommodating an electronic component reduces plating of a portion between the first surface 102 and the second surface 103 at the corner 105C. Thus, for example, when the external-connection conductor 108 is connected to the external electric circuit in the module substrate with a conductive bond such as solder, this structure can reduce short-circuiting between the conductive bond and a conductive member such as the frame-shaped metallized layer 113 or the lid 116 through the corner 105C having higher wettability caused by plating. This improves the reliability of electrical connection in the package 100 for accommodating an electronic component. With the plating layer on the corner 105C less likely to cause short-circuiting, the package 100 for accommodating an electronic component can be compact and less tall. In FIG. 4A, the corner conductor 109 extending to the corner 105C is indicated by two-dot-dash lines. With the corner conductor 109 extending to and exposed on the corner 105C, the exposed portion may be plated to increase the wettability of the corner 105C, through which short-circuiting is more likely to occur between the conductive bond and a conductive member such as the frame-shaped metallized layer 113 or the lid 116.

The package 100 for accommodating an electronic component may include an insulator 110. The insulator 110 is located between the external-connection conductor 108 and the corner conductor 109 as illustrated in, for example, FIGS. 2, 3, and 4A. The insulator 110 between the external-connection conductor 108 and the corner conductor 109 is located at a corner of the insulating substrate 101 closer to the second surface 103.

The insulator 110 is made of, for example, a ceramic material such as sintered aluminum oxide, sintered aluminum nitride, sintered mullite, or sintered glass-ceramics. The ceramic material used for the insulator 110 may be substantially the same as the ceramic material used for the insulating substrate 101. The same material herein contains, after firing, the same ceramic component as that in the upper insulating layer 106 and the lower insulating layer 107.

In the package 100 for accommodating an electronic component, the insulator 110 has a lower porosity than the insulating substrate 101. The insulator 110 thus has a higher mechanical strength than the insulating substrate 101 and is less likely to, for example, chip or crack, allowing the package 100 for accommodating an electronic component with less chipping or cracking in the corners of the insulating substrate 101.

The insulating substrate 101 may have a porosity of, for example, about 2.7 to 3.3%. The insulator 110 may have a porosity of, for example, about 2.0 to 2.5%. When the insulating substrate 101 and the insulator 110 are each made of a ceramic material, the porosity of the insulator 110 can be lowered to less than that of the insulating substrate 101 by adjusting the amount of, for example, an organic binder or a solvent to be added to raw powder of the ceramic material. The porosities of the insulating substrate 101 and the insulator 110 may be measured using, for example, the Archimedes method.

The insulator 110 is protected between the external-connection conductor 108 and the corner conductor 109. The external-connection conductor 108 and the corner conductor 109 each made of a metal material or an alloy material can more easily absorb stress than the insulating substrate 101 made of a ceramic material. The insulator 110 between the external-connection conductor 108 and the corner conductor 109 is thus less likely to chip or crack. Any chipping or cracking in the insulator 110 is more likely to stop within an area between the external-connection conductor 108 and the corner conductor 109. The package 100 for accommodating an electronic component can thus effectively reduce chipping and cracking in the corners of the insulating substrate 101. This structure can reduce chipping in the corners of the insulating substrate 101 caused by, for example, a transporting tray in contact with the package 100 for accommodating an electronic component being placed into the transporting tray, or chucking for transporting the package 100 for accommodating an electronic component. This structure can thus reduce the likelihood that foreign objects resulting from cracking in the insulating substrate 101 enter the cavity 104.

As illustrated in, for example, FIG. 4A, the corner conductor 109 includes an exposed portion 109A exposed on the first side surface 105A and an exposed portion 109A exposed on the second side surface 105B each connected to the external-connection conductor 108 in a side view. Thus, when the external-connection conductor 108 is connected to the external electric circuit in the module substrate with a conductive bond such as solder, the exposed portions 109A can be connected to the external electric circuit. This structure improves the reliability of electric connection between the package 100 for accommodating an electronic component and the module substrate. The external-connection conductor 108 and the corner conductor 109 hold the insulator 110 from inside the insulating substrate 101 to the side surface 105, thus effectively reducing chipping or cracking in the corners of the insulating substrate 101.

As illustrated in, for example, FIG. 6A, the corner conductor 109 has, in a transparent plan view, the shape of a partial ring with its center at the corner 105C. In other words, the corner conductor 109 has, in a transparent plan view, the shape of a partial ring curved in a convex inward in the insulating substrate 101. The shape of the partial ring herein refers to the shape of a part of a ring. The ring herein is not limited to being precisely annular, and may include an imprecise arc. FIG. 6A illustrates the package 100 for accommodating an electronic component viewed in a direction different from FIG. 4A. The corner conductor 109 illustrated in FIG. 6A has the same shape as the corner conductor 109 illustrated in FIG. 4A.

The package 100 for accommodating an electronic component illustrated in FIG. 6A includes the corner conductor 109 not exposed on the corner 105C, thus improving the reliability of electrical connection between the package 100 for accommodating an electronic component and the module substrate. The external-connection conductor 108 and the corner conductor 109 in the shape of a partial ring hold the insulator 110 in between, thus effectively reducing chipping or cracking in the corners of the insulating substrate 101.

Figure 6B:
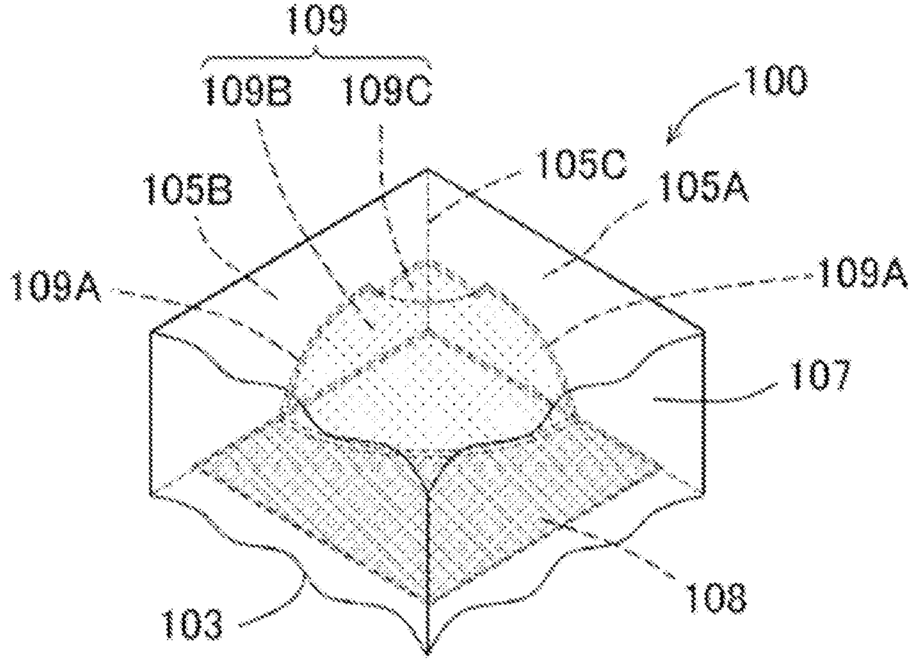
FIG. 6B is a perspective view of another example of the package for accommodating an electronic component according to the present embodiment, illustrating its main components.
Figures 7, 8:
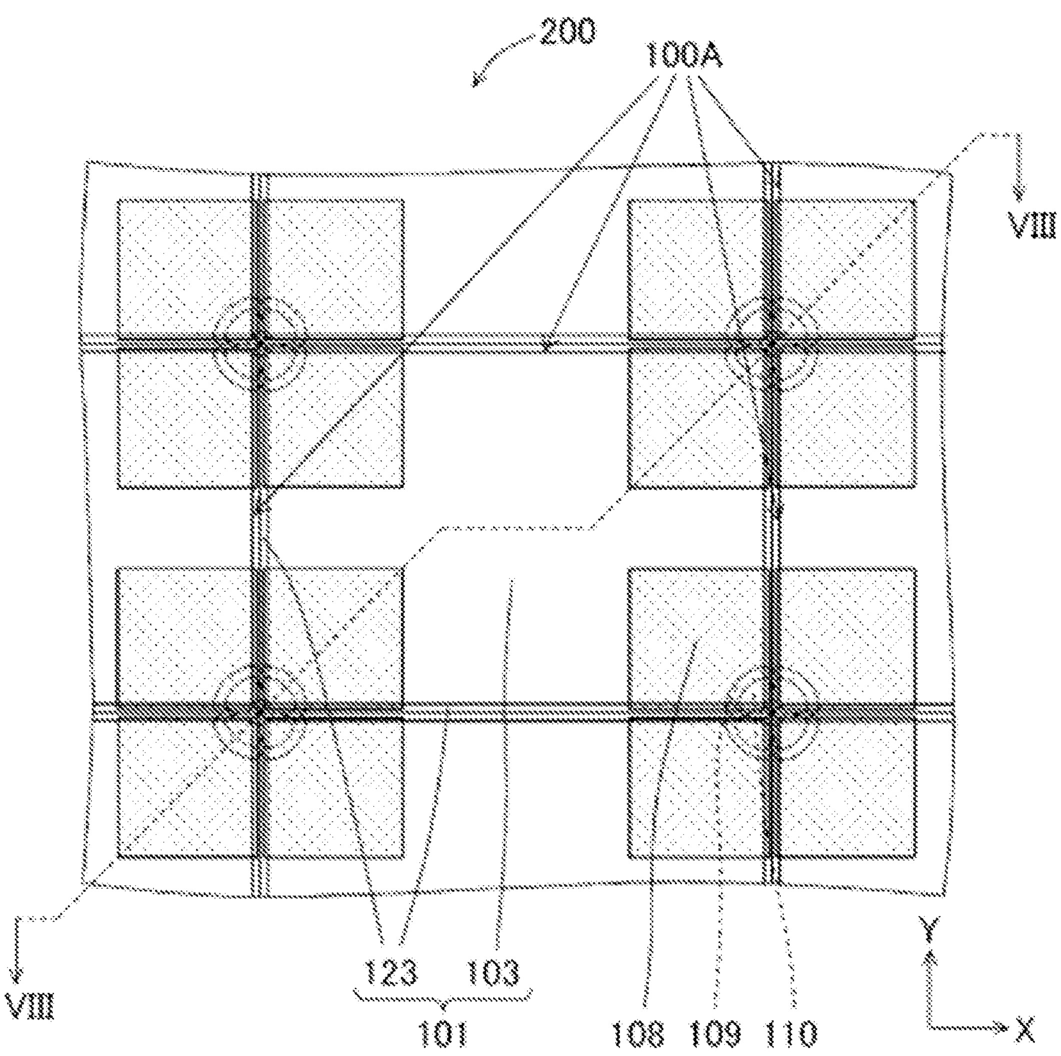
FIG. 7 is a plan view of an example multi-piece wiring substrate for fabricating packages for accommodating electronic components according to the present embodiment, illustrating its main components.
FIG. 8 is a cross-sectional view taken along line VIII-VIII in FIG. 7.

As illustrated in, for example, FIG. 6B, the corner conductor 109 may include a first portion 109B and a second portion 109C. The first portion 109B has, in a transparent plan view, the shape of a partial ring with its center at the corner 105C. The first portion 109B has the same shape as the corner conductor 109 illustrated in FIG. 6A. In other words, the corner conductor 109 illustrated in FIG. 6B is the corner conductor 109 illustrated in FIG. 6A additionally including the second portion 109C. The first portion 109B includes the outer periphery connected to the external-connection conductor 108. The first portion 109B includes the exposed portions 109A. The second portion 109C has, in a transparent plan view, the shape of a fan with its center located more inward in the insulating substrate 101 than the corner 105C. The second portion 109C includes an arc connected to the inner periphery of the first portion 109B. The fan shape herein is not limited to a precise fan and may be a fan with an imprecise arc. The arc of the second portion 109C is shorter than the inner periphery of the first portion 109B. The arc of the second portion 109C includes two ends each located inward from the corresponding end of the inner periphery of the first portion 109B. The second portion 109C is not exposed on either of the first side surface 105A and the second side surface 105B including the corner 105C of the insulating substrate 101.

In the package 100 for accommodating an electronic component illustrated in FIG. 6B, the corner conductor 109 is not exposed on the corner 105C, thus improving the reliability of electrical connection between the package 100 for accommodating an electronic component and the module substrate. The external-connection conductor 108 and the corner conductor 109 including the first portion 109B and the second portion 109C can hold a wider area of the insulator 110. As compared with the corner conductor 109 including the first portion 109B alone, the above structure can effectively reduce chipping or cracking in the corners of the insulating substrate 101.

As illustrated in FIG. 4B, for example, the exposed portions 109A of the corner conductor 109 may be spaced from the external-connection conductor 108 on the first side surface 105A and the second side surface 105B. Although this structure may include the exposed portions 109A being plated, a conductive bond such as solder used in connecting the external-connection conductor 108 to the external electric circuit in the module substrate is less likely to spread from the external-connection conductor 108 to the exposed portions 109A and flow toward the first surface 102. Thus, short-circuiting is less likely to occur between the conductive bond and a conductive member such as the frame-shaped metallized layer 113 or the lid 116 on the first surface 102. This improves the reliability of electrical connection in the package 100 for accommodating an electronic component. In the corner conductor 109 illustrated in FIG. 4B, the exposed portions 109A are exposed on a split surface 121 alone, and thus may not be plated. This structure includes no portion between the first surface 102 and the second surface 103 being wet with the conductive bond to effectively reduce short-circuiting between the conductive bond and a conductive member such as the frame-shaped metallized layer 113 or the lid 116. In FIG. 4B, the corner conductor 109 extending to the corner 105C is indicated by two-dot-dash lines. For any structure with the corner conductor 109 extending to the corner 105C and exposed, the exposed portion may be plated and may easily cause short-circuiting between the conductive bond and a conductive member such as the frame-shaped metallized layer 113 or the lid 116 through the corner 105C with higher wettability.

Figure 6C:
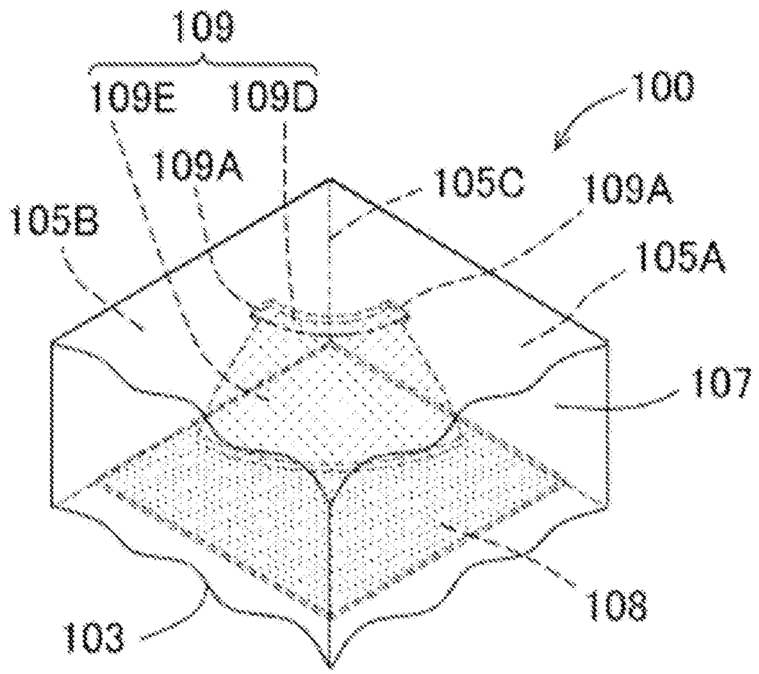
FIG. 6C is a perspective view of another example of the package for accommodating an electronic component according to the present embodiment, illustrating its main components.

As illustrated in, for example, FIG. 6C, the corner conductor 109 may include a first portion 109D and a second portion 109E. The first portion 109D has, in a transparent plan view, the shape of a partial ring with its center at the corner 105C. The first portion 109D includes the exposed portions 109A. The second portion 109E extends inward from the outer periphery of the first portion 109D into the insulating substrate 101. The second portion 109E is connected to the external-connection conductor 108. The second portion 109E may have, in a transparent plan view, the shape of a partial ring or a rectangle, or may have any other shape. FIG. 6C illustrates the package 100 for accommodating an electronic component viewed in a direction different from FIG. 4B. The corner conductor 109 illustrated in FIG. 6C has the same shape as the corner conductor 109 illustrated in FIG. 4B.

The package 100 for accommodating an electronic component illustrated in FIG. 6C includes the corner conductor 109 not exposed on the corner 105C, and includes the smaller exposed portions 109A. Thus, the portion between the first surface 102 and the second surface 103 at the corner 105C is less likely to be plated. A conductive bond such as solder used in connecting the external-connection conductor 108 to the external electric circuit in the module substrate is less likely to spread from the external-connection conductor 108 to the exposed portions 109A and flow toward the first surface 102. Thus, short-circuiting is less likely to occur between the conductive bond and a conductive member such as the frame-shaped metallized layer 113 or the lid 116 on the first surface 102. This improves the reliability of electrical connection in the package 100 for accommodating an electronic component. The corner conductor 109 illustrated in FIG. 6C includes the exposed portions 109A that may not be plated. This structure includes no portion between the first surface 102 and the second surface 103 being wet with the conductive bond to effectively reduce short-circuiting between the conductive bond and a conductive member such as the frame-shaped metallized layer 113 or the lid 116. As described above, the package 100 for accommodating an electronic component illustrated in FIG. 6C can improve the reliability of electrical connection between the package 100 for accommodating an electronic component and the module substrate. The external-connection conductor 108 and the corner conductor 109 can hold the insulator 110, thus effectively reducing chipping or cracking in the corners of the insulating substrate 101.

Figure 6D:
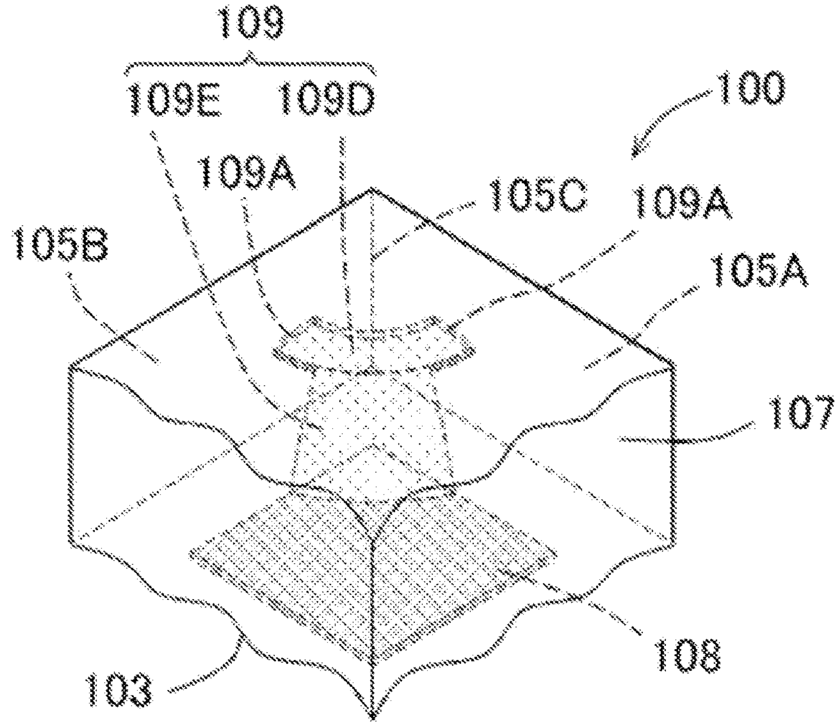
FIG. 6D is a perspective view of another example of the package for accommodating an electronic component according to the present embodiment, illustrating its main components.

In the package 100 for accommodating an electronic component, as illustrated in, for example, FIG. 6D, the external-connection conductors 108 may be spaced inward from the periphery of the second surface 103. The corner conductor 109 may include the first portion 109D and the second portion 109E, as in the package 100 for accommodating an electronic component illustrated in FIG. 6C. Similarly to the package 100 for accommodating an electronic component illustrated in FIG. 6C, the package 100 for accommodating an electronic component illustrated in FIG. 6D can improve the reliability of electrical connection between the package 100 for accommodating an electronic component and the module substrate and effectively reduce chipping or cracking in the corners of the insulating substrate 101.

Figure 6E:
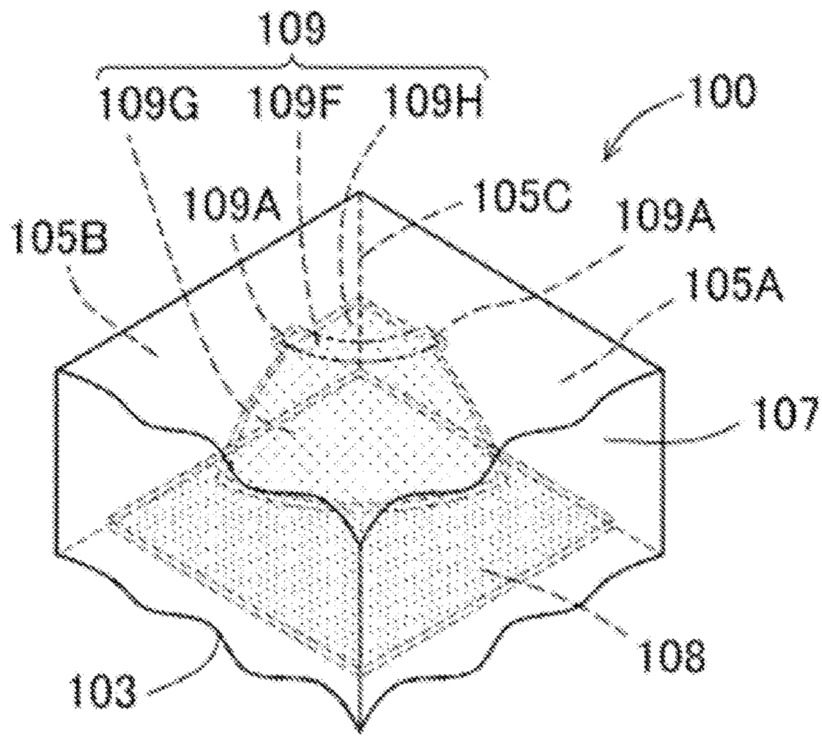
FIG. 6E is a perspective view of another example of the package for accommodating an electronic component according to the present embodiment, illustrating its main components.

As illustrated in, for example, FIG. 6E, the package 100 for accommodating an electronic component may include a first portion 109F, a second portion 109G, and a third portion 109H. The first portion 109F has, in a transparent plan view, the shape of a partial ring with its center at the corner 105C. The first portion 109F includes the exposed portions 109A. The second portion 109G extends inward from the outer periphery of the first portion 109F into the insulating substrate 101. The second portion 109G is connected to the external-connection conductor 108. The second portion 109G may have, in a transparent plan view, the shape of a partial ring or a rectangle, or may have any other shape. The third portion 109H has, in a transparent plan view, the shape of a fan with its center located more inward in the insulating substrate 101 than the corner 105C. The third portion 109H includes an arc connected to the inner periphery of the first portion 109F. The shape of the fan herein is not limited to the shape of a precise fan, and may be the shape of a fan with an imprecise arc. The arc of the third portion 109H is shorter than the inner periphery of the first portion 109F. The arc of the third portion 109HG includes two ends each located inward from the corresponding end of the inner periphery of the first portion 109F. The third portion 109H is not exposed on either of the first side surface 105A and the second side surface 105B including the corner 105C of the insulating substrate 101.

The package 100 for accommodating an electronic component illustrated in FIG. 6E can reduce, similarly to the package 100 for accommodating an electronic component illustrated in FIG. 6C, short-circuiting between a conductive bond such as solder and a conductive member such as the frame-shaped metallized layer 113 or the lid 116. The package 100 for accommodating an electronic component illustrated in FIG. 6E can hold a wider area of the insulator 110 with the external-connection conductor 108 and the corner conductor 109 including the first portion 109F, the second portion 109G, and the third portion 109H. This structure can thus effectively reduce chipping or cracking in the corners of the insulating substrate 101.

As illustrated in, for example, FIGS. 7 and 8, the package 100 for accommodating an electronic component may be fabricated by preparing a multi-piece wiring substrate (mother substrate 200) including multiple wiring board areas 100A each to be the package 100 for accommodating an electronic component and splitting the mother substrate 200 into individual packages 100 for accommodating electronic components. The mother substrate 200 includes a flat first insulating layer and a second insulating layer stacked on each other. The first insulating layer includes multiple areas each to be the lower insulating layer 107. The second insulating layer includes multiple areas each to be the upper insulating layer 106. The second insulating layer includes an opening to be the cavity 104 in each of multiple areas to be the upper insulating layers 106. The first insulating layer is hereafter also referred to as the upper insulating layer 106. The second insulating layer is also referred to as the lower insulating layer 107.

The mother substrate 200 including the upper insulating layer 106 and the lower insulating layer 107 made of sintered aluminum oxide may be fabricated in the manner described below.

A powder of a raw material, such as aluminum oxide, silicon oxide, magnesium oxide, or calcium oxide, is mixed with, for example, an organic binder, a solvent, and a plasticizer as appropriate to form slurry. The slurry is then shaped into sheets using doctor blading or calendaring to form multiple ceramic green sheets.

Subsequently, openings to be the cavities 104 are formed in a ceramic green sheet to be the upper insulating layers 106 by, for example, punching. Metallized pastes to be, for example, the frame-shaped metallized layers 113 and the feedthrough conductors 117 are placed at predetermined positions. Metallized pastes to be the feedthrough conductors 117 are placed in through-holes that are formed at predetermined positions in the ceramic green sheet by, for example, punching. Metallized pastes to be the connection pads 114, portions of the external-connection conductors 108 (portions inward from the corner conductors 109), the corner conductors 109, and the feedthrough conductors 117 are placed at predetermined positions on a ceramic green sheet to be the lower insulating layers 107. Ceramic pastes to be the insulators 110 are then placed to cover the upper surfaces of the metallized pastes to be the corner conductors 109. Metallized paste to be the remaining portions of the external-connection conductors 108 (portions overlapping the corner conductors 109) are placed on the ceramic pastes.

The ceramic green sheets with the metallized pastes and the ceramic pastes at the predetermined positions then undergo a pressurizing process. In some embodiments, the ceramic pastes to be the insulators 110 may be placed on the metallized pastes to be the corner conductors 109, and the metallized pastes to be the external-connection conductors 108 may be placed on the ceramic pastes. The ceramic green sheets then undergo a pressurizing process. The ceramic green sheet to be the upper insulating layers 106 and the ceramic green sheet to be the lower insulating layers 107 processed in this manner are stacked on each other and fired at, for example, 1200 to 1600° C. to obtain the mother substrate 200.

As illustrated in, for example, FIG. 7, the ceramic paste to be the insulator 110 is applied to have the shape of a fan that is one quarter of a circle (the shape of a circle on the mother substrate 200) and to have a maximum thickness at the corner 105C of the insulating substrate 101. This allows the corner conductor 109 to be easily convexly curved toward the first surface 102 from the external-connection conductor 108 to the corner 105C of the insulating substrate 101 in the pressurizing process. Thus, the corner conductor 109 can be located at a gradually greater distance to the second surface 103 along the thickness of the insulating substrate 101. In other words, the thicker portion of the insulator 110 prepared before the pressurizing process pushes the metallized paste to be the corner conductor 109 more inward in the ceramic green sheets to be the insulating substrate 101.

With the fabrication method for the mother substrate 200 described above, the ceramic green sheet to be the frame-shaped upper insulating layers 106 and the ceramic green sheet to be the flat lower insulating layers 107 are stacked on each other. In some embodiments, the mother substrate 200 may be fabricated differently. For example, the ceramic green sheet to be the insulating substrates 101 with the metallized pastes and the ceramic pastes applied on the sheet may be pressed with a pressing tool including protrusions (protruded portions) and recesses to form the concave cavities 104 on its surface. The pressing tool is positioned to apply pressure to portions each to be the bottom of the cavity 104. Portions on the ceramic green sheet pressed by the protrusions of the pressing tool are to be the cavities 104, and portions on the ceramic green sheet pressed by the recesses of the pressing tool are to be frames (upper insulating layers 106) each surrounding the mount portion 102A. The metallized pastes to be the external-connection conductors 108 and the ceramic pastes to be the insulators 110 on the second surface 103 of the ceramic green sheet are pressed by the pressing tool to cause the metallized pastes to be the corner conductors 109 curved toward the first surface 102. The metallized pastes to be the external-connection conductors 108 are pressed to be flush with the second surface 103 of the insulating substrate 101. A binder added to the ceramic green sheet, the metallized pastes, and the ceramic pastes may have a glass transition temperature lower than the temperature for pressurizing with a metal mold. Such a binder allows intended molding when the ceramic green sheet and other components are pressed by the pressing tool. For example, the exposed surfaces of the frame and the external-connection conductor 108 can be flush with the second surface 103 of the insulating substrate 101.

With the recess of the pressing tool having a constant width and a constant depth, the frame portion has a constant width and a constant height after the pressurizing process. This improves the dimensional accuracy of the frame after the pressurizing process. The mother substrate 200 including multiple wiring board areas 100A to be the packages 100 for accommodating electronic components may be fabricated by firing a molded body including the lower insulating layer 107 with the external-connection conductors 108 and other components and the upper insulating layer 106 with the frame-shaped metallized layers 113 and other components integral with each other. The mother substrate 200 including multiple wiring board areas 100A to be the packages 100 for accommodating electronic components may be fabricated by firing a molded body including the lower insulating layer 107 with the external-connection conductors 108 and other components and the upper insulating layer 106 with the frame-shaped metallized layers 113 and other components integral with each other.

The packages 100 for accommodating electronic components are obtained by splitting the multi-piece wiring substrate (mother substrate 200). The mother substrate 200 includes the multiple wiring board areas 100A arranged vertically and horizontally (in Y-direction and X-direction) on its substrate surface. The mother substrate 200 includes separation grooves 123 (hereafter, also simply referred to as grooves 123) each at the boundary between two wiring board areas 100A adjacent to each other on the first surface 102 and on the second surface 103. Individual packages 100 for accommodating electronic components are obtained by splitting the mother substrate 200 along the separation grooves. The grooves 123 are formed by partially cutting the mother substrate 200 using a laser or a cutter blade before or after firing. To form the grooves 123 by laser processing, intersections between the grooves 123 in X-direction and the grooves 123 in Y-direction, or in other words, portions corresponding to the corners 105C of the insulating substrate 101, receive laser irradiation twice, or specifically when the grooves 123 in X-direction are formed and when the grooves 123 in Y-direction are formed. As illustrated in, for example, FIGS. 4A and 4B, this may form a recess 125 deeper than the grooves in other portions at the corner 105C of the insulating substrate 101. The corner conductor 109 extending to the corner 105C may be exposed on the recess 125 being the bottom of the separation groove 123 at the corner 105C. In FIGS. 4A and 4B, the side surface 105 includes the split surface 121 in its middle portion in the thickness direction. A slope 122 defined by the grooves 123 is located closer to the first surface 102 or the second surface 103 than the split surface 121. The boundary between the split surface 121 and the slope 122 serves as the bottom of the groove 123. The slope 122 includes a first slope 122*a* connected to the first surface 102 and a second slope 122*b* connected to the second surface 103. The exposed portions 109A in the corner conductor 109 are located on the split surface 121.

Before the mother substrate 200 is split into individual pieces, the exposed surfaces of the wiring conductors WC such as the corner conductors 109, the frame-shaped metallized layers 113, the connection pads 114, and the external-connection conductors 108 may be plated. The wiring conductors WC may be plated by, for example, electroplating. For electroplating, a supply conductor for supplying a current is placed on an area other than the wiring board areas 100A on the mother substrate 200. Connection conductors may be placed to connect the supply conductor to the wiring board areas 100A located at the outermost periphery of the mother substrate 200 and to connect wires across adjacent wiring board areas 100A. The supply conductor can thus supply a current to all the wiring conductors WC in each wiring board area 100A to plate the exposed wiring conductors WC in each wiring board area 100A. With the corner conductor 109 exposed on the recess 125 at the corner 105C, the exposed portion may also be plated. The plated exposed portion is located closer to the first surface 102 than to the second slope 122*b* and is easily wet with a conductive bond such as solder, which may cause short-circuiting between the external-connection conductor 108 and the frame-shaped metallized layer 113 on the first surface 102. A compact and less tall package for accommodating an electronic component may be susceptible to such short-circuiting.

The mother substrate 200 for obtaining the packages 100 for accommodating electronic components includes the corner conductors 109 that serve as connection conductors described above. The mother substrate 200 includes the corner conductors 109 in adjacent wiring board areas 100A connected to each other. The corner conductor 109 simply serving as a connection conductor may be a narrow strip-shaped wiring conductor. In the present embodiment, the corner conductors 109 is, as illustrated in, for example, FIGS. 9A to 9E, substantially dome-shaped to protect the insulator 110 in cooperation with the external-connection conductors 108. The corner conductors 109 in the mother substrate 200 illustrated in FIGS. 9A to 9E correspond to the respective corner conductors 109 in the packages 100 for accommodating electronic components illustrated in FIGS. 6A to 6E. FIGS. 9A to 9E illustrate the mother substrates 200 before the separation grooves 123 are formed. FIGS. 9A to 9E simply illustrate a portion of the lower insulating layer 107, one external-connection conductor 108, and one corner conductor 109.

The corner conductor 109 extends from the external-connection conductor 108 toward the corner 105C at a gradually greater distance to the external-connection conductor 108, and does not extend to the corner 105C. Thus, as illustrated in, for example, FIGS. 9A to 9E, each of the corner conductors 109 in the mother substrate 200 is dome-shaped and has its open top overlapping the corresponding corner 105C of the four insulating substrates 101. This structure reduces the likelihood that the corner conductor 109 is exposed on the recess 125 at the corner 105C as the bottom of the separation groove 123. When the groove 123 is formed by laser processing, debris from the corner conductor 109 resulting from laser processing is less likely to adhere to the recess 125. With the bottom of the groove 123 less likely to be plated, a conductive bond such as solder is less likely to cause short-circuiting between the external-connection conductor 108 and the frame-shaped metallized layer 113. This facilitates splitting of the mother substrate 200. In the example illustrated in FIG. 9D, the external-connection conductors 108 do not overlap the peripheries of the wiring board areas 100A and are spaced inward from the peripheries of the wiring board areas 100A. This reduces the likelihood that debris from the external-connection conductors 108 resulting from laser processing adheres to the recesses 125 and facilitates splitting of the mother substrate 200.

The mother substrate 200 may be plated by electroless plating before being split into individual pieces. In this case, the corner conductor 109 may not serve as the connection conductor and thus may not extend to the side surface 105. However, the corner conductor 109 may have the same or similar shape as the corner conductor 109 in the above embodiment. The corner conductor 109 extending to the side surface 105 can advantageously protect the insulator 110. As illustrated in FIG. 1011, the corner conductor 109 may extend to the side surfaces 105 with the exposed portions 109A simply on the second slopes 122*b*. In this case, the exposed portions 109A can be plated by electroless plating before the mother substrate 200 is split into individual pieces. The exposed portions 109A are plated and protected and thus are less likely to corrode when the corner conductor 109 is made of a relatively corrodible material such as molybdenum or copper selected from the metal materials described above. As in the embodiment described above, without the corner conductor 109 extending to the corner 105C, a conductive bond such as solder is less likely to cause short-circuiting between the external-connection conductor 108 and the frame-shaped metallized layer 113. The external-connection conductor 108 and the corner conductor 109 can hold the insulator 110, thus effectively reducing chipping or cracking in the corners of the insulating substrate 101. As illustrated in FIG. 10, the exposed portions 109A may be located close to the second surface 103 on the second slopes 122*b*. The exposed portions 109A may be connected to the external-connection conductor 108. With the exposed portions 109A easily wet with a conductive bond such as solder located close to and in contact with the second surface 103 (or an external-connection conductor 108), a conductive bond such as solder flows less far from the external-connection conductor 108. A conductive bond such as solder is thus less likely to cause short-circuiting between the external-connection conductor 108 and the frame-shaped metallized layer 113.

As illustrated in, for example, FIG. 11, in one or more embodiments of the present disclosure, an electronic apparatus 300 includes the above package 100 for accommodating an electronic component and the electronic component 112 mounted on the package 100 for accommodating an electronic component. The electronic apparatus 300 thus reduces chipping or cracking in the package 100 for accommodating an electronic component in use and has high dimensional accuracy. In other words, the electronic apparatus 300 having high dimensional accuracy can be fabricated using the package 100 for accommodating an electronic component with less chipping or cracking in the insulating substrates 101. The electronic apparatus 300 also reduces the likelihood that the conductive paths such as the feedthrough conductors 117 are disconnected or the external-connection conductors 108 separate from the insulating substrate 101 due to chipping or cracking in the insulating substrate 101. The electronic apparatus 300 can thus have highly reliable electrical connection between the package 100 for accommodating an electronic component and a module substrate 400.

Examples of the electronic component 112 include a piezoelectric element such as a ceramic piezoelectric element or a surface acoustic wave element, a semiconductor device, a capacitor, and a resistance, in addition to a piezoelectric oscillator that is a crystal oscillator such as a temperature compensated crystal oscillator (TCXO).

The electrodes (not illustrated) of the electronic component 112 may be connected to the connection pad 114 with a bond 115 such as a conductive bond as illustrated in, for example, FIG. 11.

In one or more embodiments of the present disclosure, an electronic module 500 includes the electronic apparatus 300 and the module substrate connected to the electronic apparatus 300. The electronic module 500 has a high bonding strength between the insulating substrate 101 and the external-connection conductor 108 in the package 100 for accommodating an electronic component and thus has highly reliable electric connection between the electronic apparatus 300 and the module substrate 400. The electronic module 500 can thus have high operational reliability.

The present disclosure is not limited to the embodiments described above and may be, for example, changed variously without departing from the spirit and scope of the present disclosure. For example, the package 100 for accommodating an electronic component may include multiple cavities that are open in the first surface 102. Each of the cavities may include a mount portion. In one example of the embodiment described above, the pair of connection pads 114 is located in the cavity 104. However, any number of connection pads 114 may be located in the cavity 104 as appropriate for, for example, the shape or the type of an electronic component to be mounted. In one example of the embodiment described above, four external-connection conductors 108 are located at the four corners of the second surface 103 of the insulating substrate 101. However, additional external-connection conductors 108 may be at positions other than the corners of the second surface 103 as appropriate for, for example, the size of the package 100 for accommodating an electronic component, the type of the electronic apparatus, and the type of an electronic component to be mounted.

The package 100 for accommodating an electronic component may include, for example, a plate-like insulating substrate 101 as illustrated in, for example, FIG. 12. In this case, the mount portion 102A to receive the electronic component 112 is located on the first surface 102 of the insulating substrate 101 and covered with a box-shaped (or hat-shaped) lid 116 to accommodate the electronic component 112 inside. The electronic apparatus 300 may cover and seal the electronic component 112 mounted on the mount portion 102A in the package 100 for accommodating an electronic component using the box-shaped lid 116 with flanges. The flanges of the lid 116 and the outer periphery of the first surface 102 of the insulating substrate 101 may be bonded with a conductive bond such as the brazing material 118. The insulating substrate 101 includes a single insulating layer in the example illustrated in FIG. 12. However, the insulating substrate 101 may include multiple insulating layers stacked on one another.

REFERENCE SIGNS

100 package for accommodating an electronic component
100A wiring board area
101 insulating substrate
102 first surface
102A mount portion
103 second surface
104 cavity
105 side surface
105A first side surface
105B second side surface
105C corner
106 upper insulating layer
107 lower insulating layer
108 external-connection conductor
109 corner conductor
109A exposed portion
109B, 109D, 109F first portion
109C, 109E, 109G second portion
109H third portion
110 insulator
112 electronic component
113 frame-shaped metallized layer
114 connection pad
115 bond
116 lid
117 feedthrough conductor
118 brazing material

121 split surface
122 slope
122*a* first slope
122*b* second slope
123 separation groove
125 recess
200 mother substrate
300 electronic apparatus
400 module substrate
500 electronic module

The invention claimed is:

1. A package for accommodating an electronic component, comprising:

an insulating substrate including a first surface including a mount portion to receive the electronic component, a second surface opposite to the first surface, a first side surface connecting the first surface and the second surface, a second side surface connecting the first surface and the second surface and continuous with the first side surface, and a corner at which the first side surface and the second side surface intersect and extending from the first surface to the second surface;

an external-connection conductor on the second surface; and a corner conductor extending from the external-connection conductor toward the corner, wherein the corner conductor extends from the external-connection conductor toward the corner at a gradually greater distance to the external-connection conductor and includes exposed portions exposed on the first side surface excluding the corner and on the second side surface excluding the corner, and wherein the corner conductor does not extend to the corner such that the corner conductor has no exposed portion on the corner.

2. The package according to claim 1, wherein the exposed portions are connected to the external-connection conductor in a side view of the first side surface or the second side surface.

3. The package according to claim 1, wherein the corner conductor has, in a transparent plan view, a shape of a partial ring including a center at the corner.

4. The package according to claim 1, wherein the corner conductor includes a first portion and a second portion, the first portion has, in a transparent plan view, a shape of a partial ring including a center at the corner, and includes the exposed portions and an outer periphery connected to the external-connection conductor, and the second portion has, in a transparent plan view, a fan shape including a center located more inward in the insulating substrate than the corner and an arc connected to an inner periphery of the first portion.

5. The package according to claim 1, wherein the exposed portions are spaced from the external-connection conductor in a side view of the first side surface or the second side surface.

6. The package according to claim 5, wherein the corner conductor includes a first portion and a second portion, the first portion has, in a transparent plan view, a shape of a partial ring including a center at the corner, and includes the exposed portions, and the second portion extends inward from an outer periphery of the first portion into the insulating substrate and is connected to the external-connection conductor.

7. The package according to claim 1, wherein each of the first side surface and the second side surface includes a first slope connected to the first surface, a second slope connected to the second surface, and a split surface between the first slope and the second slope, and the exposed portions are located on the split surface alone.

8. The package according to claim 1, wherein each of the first side surface and the second side surface includes a first slope connected to the first surface, a second slope connected to the second surface, and a split surface between the first slope and the second slope, and the exposed portions are located on the second slope alone.

9. The package according to claim 1, wherein the insulating substrate includes an insulator between the external-connection conductor and the corner conductor, and the insulator has a lower porosity than another portion of the insulating substrate.

10. An electronic apparatus, comprising:

the package according to claim 1; and an electronic component mounted on the package.

11. An electronic module, comprising:

the electronic apparatus according to claim 10; and a module substrate connected to the electronic apparatus.

* * * * *